(12) United States Patent
Paciorek

(10) Patent No.: US 6,394,851 B1
(45) Date of Patent: May 28, 2002

(54) CIGARETTE LIGHTER ADAPTER WITH ONE-PIECE SOLDERLESS GROUND CONTACT

(75) Inventor: Matthew A. Paciorek, Mount Prospect, IL (US)

(73) Assignee: Andrew Corporation, Addison, IL (US)

(*) Notice: Subject to any disclaimer, the term of this patent is extended or adjusted under 35 U.S.C. 154(b) by 0 days.

(21) Appl. No.: 09/894,710

(22) Filed: Jun. 28, 2001

(51) Int. Cl.[7] .............................................. H01R 24/04
(52) U.S. Cl. ....................................................... 439/668
(58) Field of Search ................................. 439/668, 669, 439/638

(56) References Cited

U.S. PATENT DOCUMENTS

| | | |
|---|---|---|
| 1,949,596 A | 3/1934 | Anderson |
| 2,252,553 A | 8/1941 | Campbell |
| 2,605,318 A | 7/1952 | Morgenstern |
| 2,954,544 A | 9/1960 | Focosi |
| 3,928,952 A | 12/1975 | Whyte |
| 4,173,761 A | 11/1979 | Liautaud |
| 4,198,638 A | 4/1980 | Carolus |
| 4,322,122 A | 3/1982 | Schwartz et al. |
| 4,459,463 A | 7/1984 | Knowles |
| 4,604,529 A | 8/1986 | Grimsley et al. |
| 4,682,139 A | 7/1987 | Kuo |
| 4,789,361 A | 12/1988 | Kinzalow et al. |
| 5,131,869 A | 7/1992 | Wharton |
| 5,170,067 A | 12/1992 | Baum et al. |
| 5,199,904 A | 4/1993 | Wharton |
| 5,201,677 A | 4/1993 | Takayama |
| 5,261,838 A | 11/1993 | Fujie |
| 5,271,684 A | 12/1993 | Phillips |
| 5,431,585 A | 7/1995 | Fan |
| 5,569,053 A | 10/1996 | Nelson et al. |
| 5,583,522 A | 12/1996 | Radomski et al. |
| 5,593,323 A | 1/1997 | Dernehl |
| 5,626,496 A | 5/1997 | Hahn |
| 5,896,110 A | 4/1999 | Kojima |
| 5,961,353 A | * 10/1999 | Rivenbark .................. 439/668 |
| 5,964,623 A | 10/1999 | Maher et al. |

* cited by examiner

Primary Examiner—Tho D. Ta
Assistant Examiner—Ann McCamey
(74) Attorney, Agent, or Firm—Vedder, Price, Kaufman & Kammholz

(57) ABSTRACT

An adapter for establishing electrical connection between electrical power system of a vehicle and an electronic device includes a elongated housing having a body portion in a barrel portion sized to fit within the cigarette receptacle. A circuit board is disposed within the housing with a connecting circuit for providing a connection between the electronic device and the vehicle power system. A first contact member disposed in the barrel portion contacts the cigarette lighter receptacle hot contact. A second contact member disposed in the barrel portion contacts the cigarette lighter receptacle ground contact. The second contact member includes a clip in a pair of terminal portions. Each clip has a pair of legs and an interconnecting spine portion. Each leg has a free end opposite the spine portion so that the free ends cooperatively define an entrance to a passageway. The terminal portions each include a tail, a body, a contact arm, and a free end for interconnecting the vehicle power system ground contact and the circuit board ground connecting circuit. Each tail portion is formed normal to the legs as a part of and coplanar with one of the legs. The clip contacts the circuit board in the connecting circuit ground portion thereof. The contact arm portions are disposed in opposing alignment with each other on opposite sides, such that forces they exert upon the circuit board generally balance each other to thereby avoid the imposition of detrimental unbalanced stress on the circuit board.

20 Claims, 4 Drawing Sheets

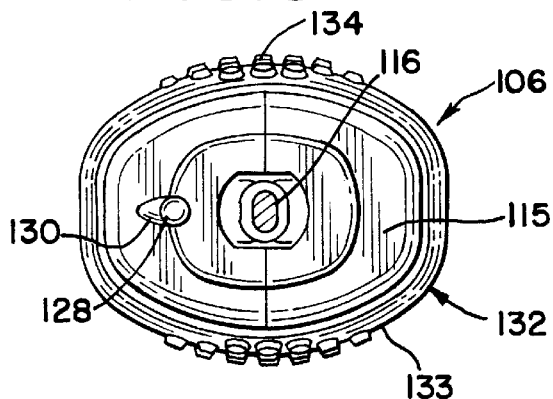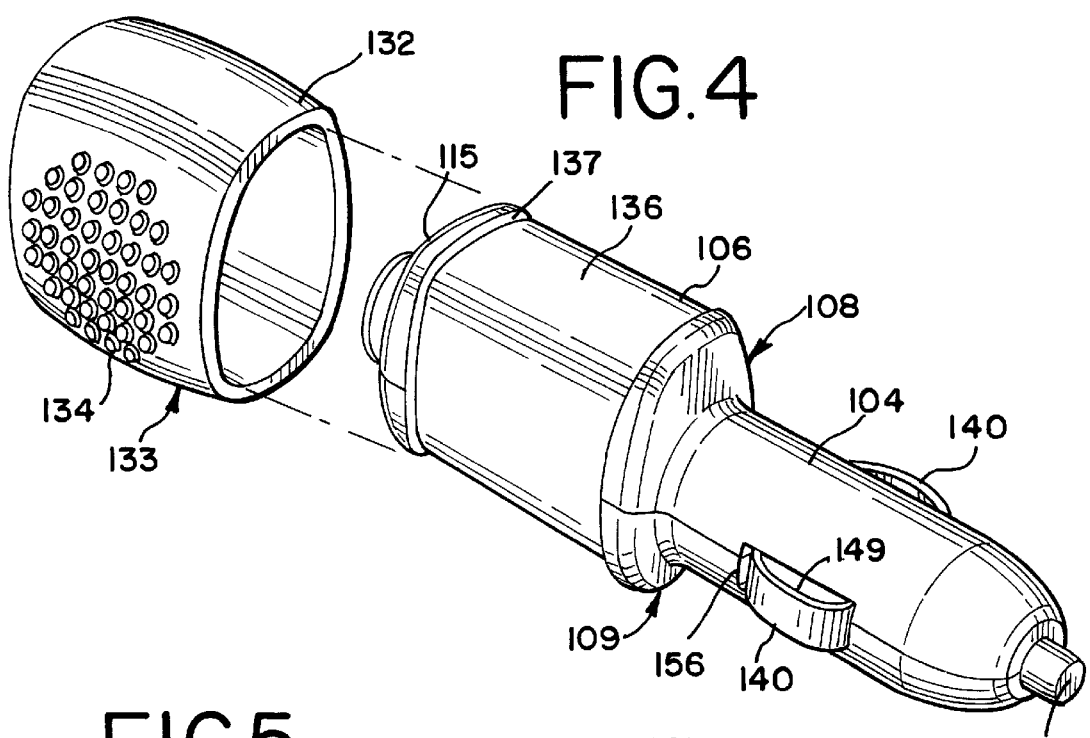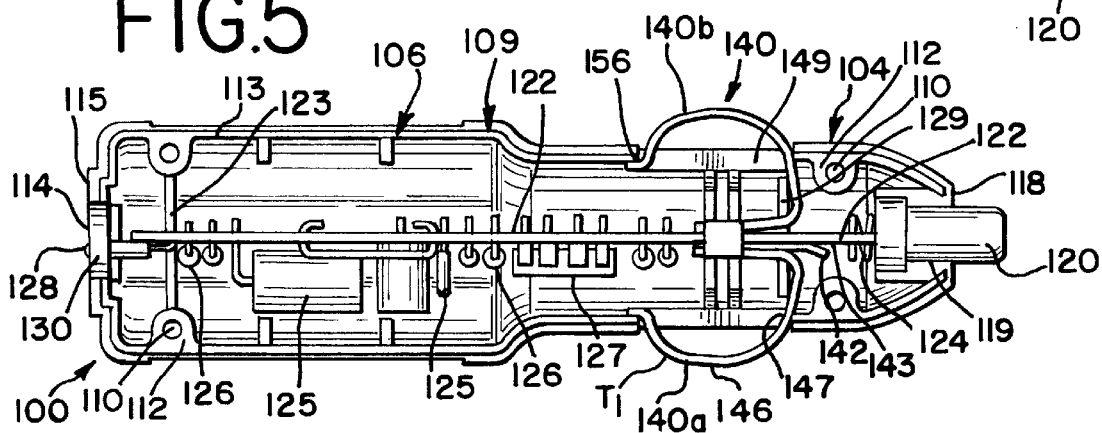

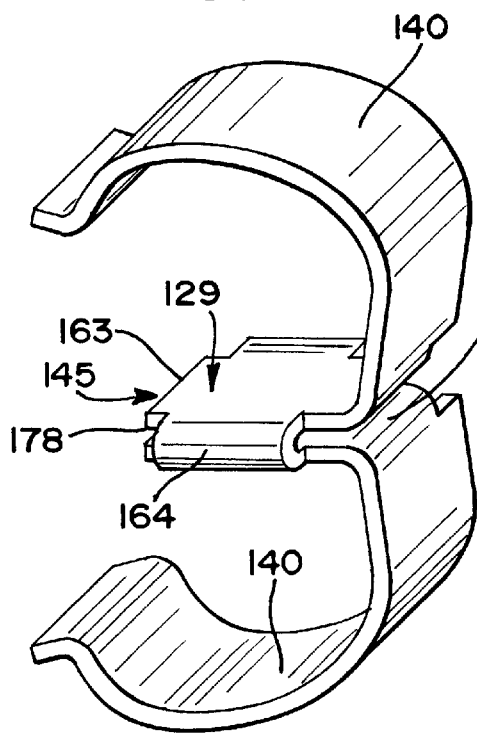
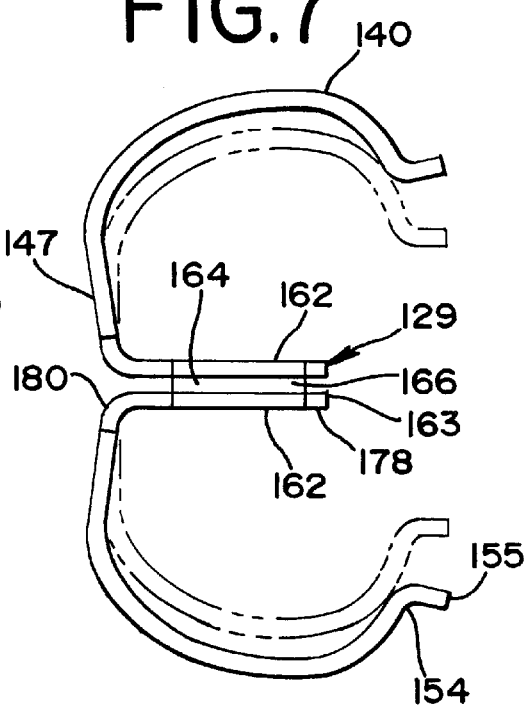
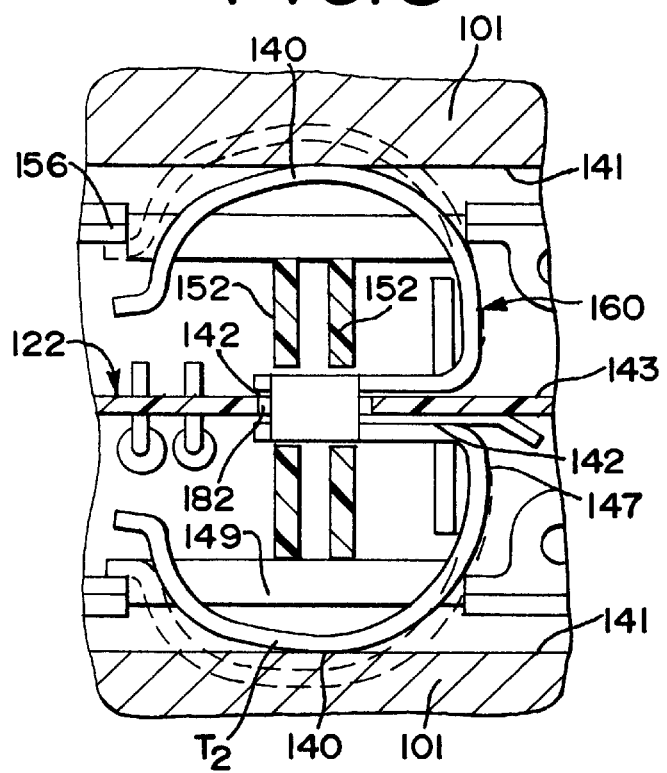

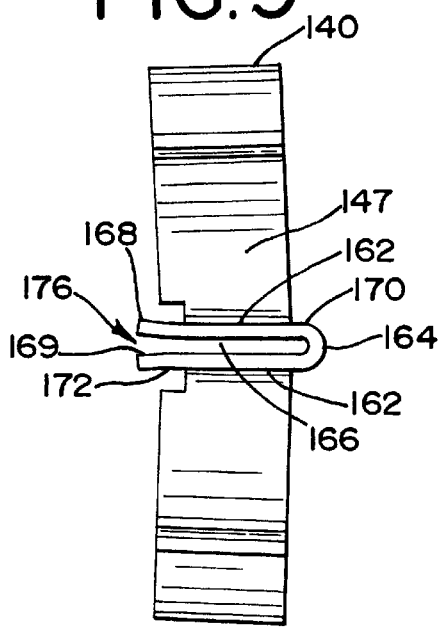
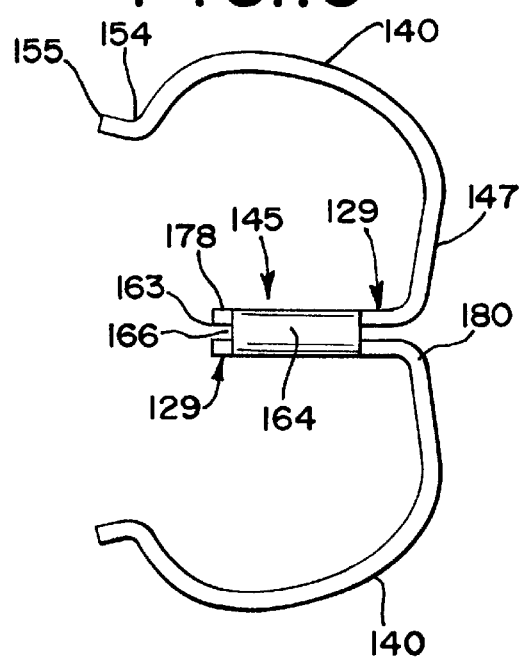
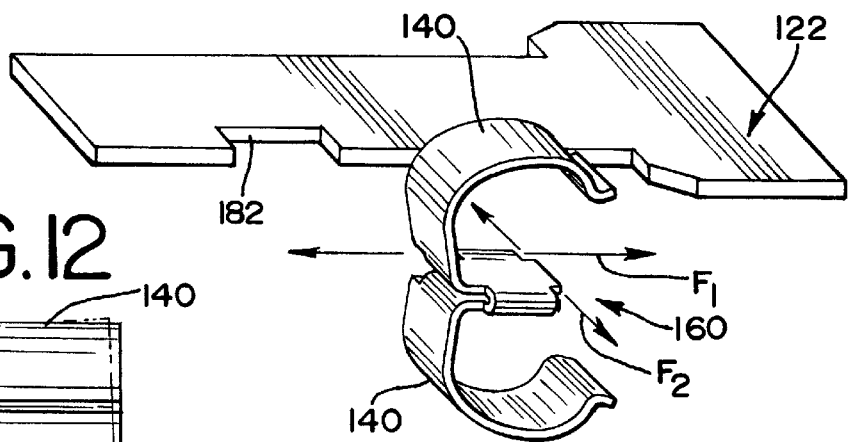
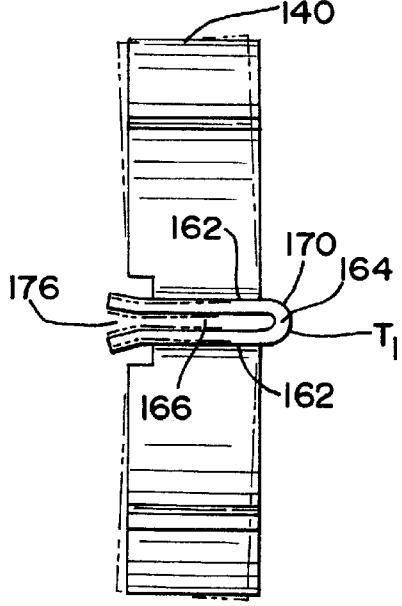

CIGARETTE LIGHTER ADAPTER WITH ONE-PIECE SOLDERLESS GROUND CONTACT

BACKGROUND OF THE INVENTION

The present invention relates generally to wireless telephones, and more particularly, to adapters that power a wireless telephone for use in a vehicle.

An adapter is required to run the wireless telephone off of the vehicle electrical power rather than the telephone battery. The present invention is directed to an adapter for a wireless telephone that utilizes a solderless one-piece ground contact.

The prior art describes a number of adapters that permit operation of various electronic devices from the electrical power source of a vehicle. These adapters all share certain common components. Each adapter must have a "hot" contact that is connected to the vehicle "hot" source of power, and each adapter must have a "return" or "ground" contact that is connected to the ground of the vehicle.

Some of these adapters utilize internal circuit boards and have their ground contacts connected directly to the circuit board, such as by soldering. The soldered joint may be positioned on the circuit board in an area where it undergoes great stress, inasmuch as the adapter ground contacts are typically themselves compressed when inserted into a cigarette lighter receptacle. Other ground contacts are not soldered to the circuit board, but rather are disposed in the adapter housing such that at least one interconnecting wire may be soldered thereto for opposite termination of the interconnecting wire at a remote circuit board or wire by soldering or other means. The ground contacts are positioned in such a manner that any contact forces exerted by the contacts on the adapter circuit board balance each other so as not to apply any detrimental, unbalanced stress to the circuit board or other part of the adapter. One-piece contact arms have also been utilized with cigarette lighter adapters which may or may not have a circuit board disposed inside the adapter. Those which do not have a circuit board use a wire and solder solution to connect the ground contact to the vehicle ground system. In an adapter which has a circuit board, the ground contact engages only one side of the circuit board in an undisclosed manner.

SUMMARY OF THE INVENTION

Accordingly, it is a general object of the present invention to provide an improved adapter for connection of a wireless telephone to a source of electrical power in a vehicle.

Another object of the present invention is to provide an adapter for connecting a wireless telephone to a vehicle's cigarette lighter receptacle, wherein the adapter has an internal circuit board containing charging and connection circuits, and a ground contact that connects the circuit ground to the vehicle ground, wherein the ground contact engages the circuit board in a solderless connection.

Still another object of the present invention is to provide a cigarette lighter adapter that provides an electrical connection between a cigarette lighter of a vehicle and a wireless telephone, the adapter having a charging and connection circuit disposed on a circuit board held within an adapter housing, the adapter having a ground contact in the form of a one-piece spring member having clip legs in confronting relationship to each other and to a common point on the circuit board, the clip legs exert substantially equal contact forces on the circuit board when the adapter is inserted into the vehicle cigarette lighter receptacle.

Yet another object of the present invention is to provide a cigarette lighter adapter for a wireless telephone which has less parts and is easier to manufacture and less expensive.

These objects are accomplished by at least one principal aspect of the present invention in which the adapter has a housing for relevant components. The housing contains a circuit board therein. The circuit board has a ground circuit defined therein on with one or more contact pads. A resilient spring member is provided as a ground contact and is held within the adapter housing having a portion of the ground contact in opposition to the ground circuit contact pad(s). The spring member may contact the ground circuit contact pad(s) and is forced into further contact therewith when the ground contact becomes compressed during insertion of the adapter into a cigarette lighter receptacle.

In another principal aspect of the present invention, the ground contact takes the form of a U-shaped clip, with each clip leg having a contact arm that extends therefrom and over the clip. The U-shaped clip is associated with the circuit board contact pad(s) such that the circuit board is received between the legs of the U-shaped clip. The contact arms are positioned within the adapter in opposition to each other so that the contact forces that they exert on the circuit board whether the adapter is in or out of a cigarette lighter receptacle, substantially balance each other so as not to apply the detrimental stress to the circuit board.

These and other objects, features and advantages of the present invention will become apparent from the following detailed description, taken in conjunction with the accompanying drawings, wherein like reference numerals refer to like parts.

BRIEF DESCRIPTION OF THE DRAWINGS

In the course of the following detailed description, reference will be made to the attached drawings in which:

FIG. 3 is an elevation view of the rear end of the adapter of FIG. 1;

FIG. 4 is the same view as FIG. 1, but with the exterior grip cover removed therefrom;

FIG. 5 is an elevational view of the adapter of FIG. 1 with one of the housing halves and the exterior grip cover removed for clarity, illustrating the internal mounting of the adapter components therein;

FIG. 6 is a perspective view of a ground contact member used in the adapter of FIG. 1;

FIG. 7 is a front elevational view of the ground contact member of FIG. 6, illustrating its spring movement;

FIG. 8 is an enlarged view of a portion of the adapter of FIG. 5, illustrating in detail the contact that occurs between the ground contact member and circuit board when the adapter is inserted into a cigarette lighter receptacle;

FIG. 9 is a side elevational view of the ground contact member of FIG. 6;

FIG. 10 is a rear elevation view of the ground contact member of FIG. 6;

FIG. 11 is a perspective exploded detail view of the ground contact member and circuit board of FIG. 5 prior to assembly; and FIG. 12 is a detailed side view of the clip portion illustrating a first tensioned state.

DETAILED DESCRIPTION OF THE PREFERRED EMBODIMENTS

Figure 1:
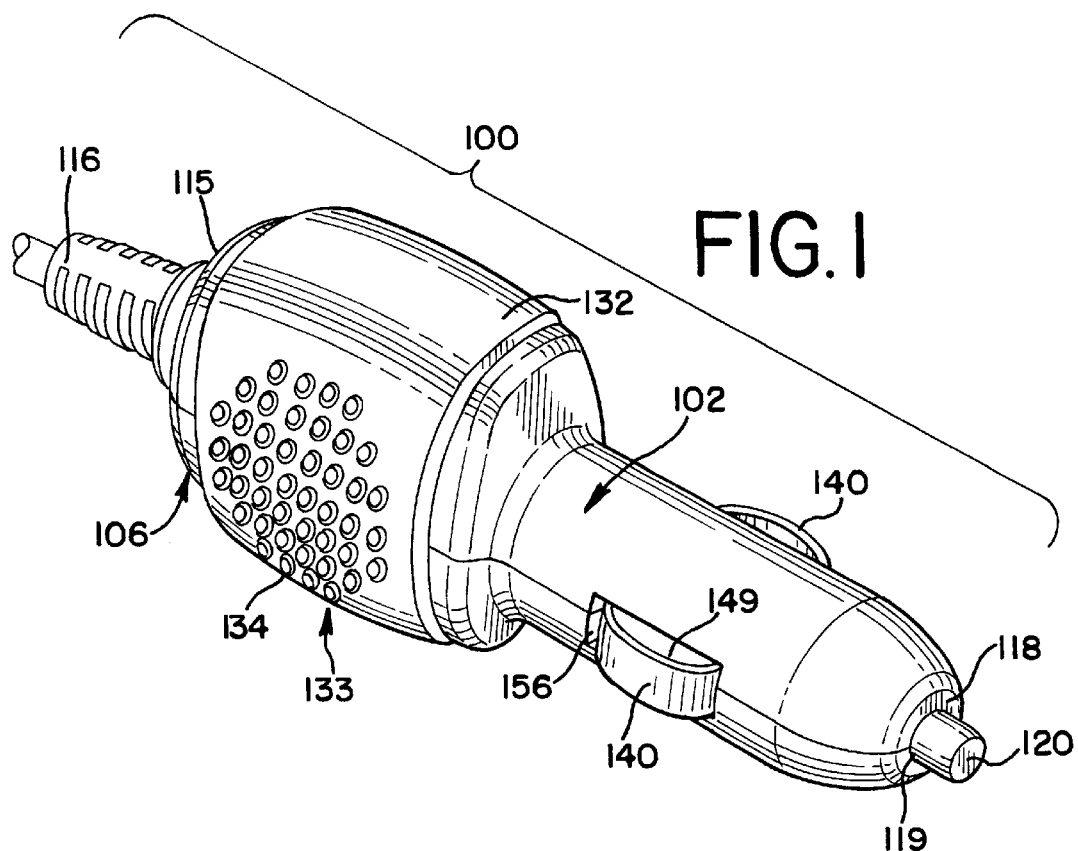
FIG. 1 is perspective view of a cigarette lighter adapter constructed in accordance with the principles of the present invention.
Figure 2:
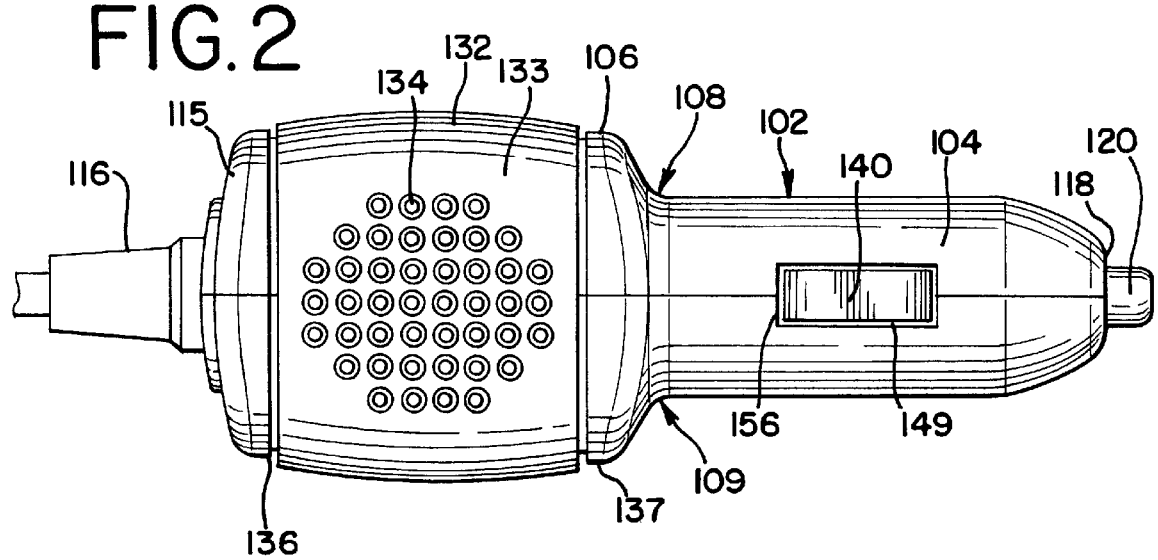
FIG. 2 is an elevational view of the right side of the adapter in FIG. 1.

FIG. 1 illustrates a cigarette lighter adapter 100 constructed in accordance with the principles of the present invention. The adapter 100 is insertable into a cigarette lighter socket 101 (FIG. 8) of a vehicle to draw power from the vehicle in order to power an electronic device, such as a wireless telephone. The adapter 100 has a plastic housing 102 that encloses the relevant components thereof and may be considered as having two interconnected sections. One section includes an elongated, cylindrical barrel portion 104 having a diameter that is dimensioned to be received within the vehicle lighter socket 101. The second section is a main body portion 106 that is attached to, but generally larger than, the barrel. The main body portion 106 and the barrel portion 104 are hollow so that they cooperatively form an internal cavity of the adapter 100 that houses and encloses the electronic components of the adapter 100.

The barrel and main body portions 104 and 106 of the adapter 100 may be easily formed from a plastic by a suitable process such as injection molding. The adapter housing 102 may be formed by molding two opposing halves 108, 109 which engage each other. One such half 109 is illustrated in FIG. 5 and the housing half 109 includes recessed female receptacles 110 formed in boss sections 112 of the housing. These receptacles 110 receive male pins (not shown) that project from the other housing half 108 and the engagement between the two housing halves 108, 109 is in the manner of a press-fit engagement. An interior lip 113 may be provided along the interior edges of the housing half 109 and this lip may be received in a corresponding recess of the other housing half 108.

Each housing half 108, 109 includes a passage 114 formed in the rear wall 115 thereof through which an electrical cord 116 extends for connection to the electronic device (not shown). At the forward end 118, each housing half 108, 109 includes a similar cylindrical passage 119 formed therein which accommodates a cylindrical conductive tip contact 120. This tip contact engages, as is known in the art, a "hot" contact of the vehicle electrical system that is typically disposed at the center and end portion of the cigarette lighter socket 101. The tip contact 120 is electrically connected in a conventional manner to one or more "hot" or "live" circuits disposed on a circuit board 122. This connection is illustrated in FIG. 5 as a conductive spring 124 that biases the tip contact 120 forwardly within the housing end passage 119. The spring 124 is connected to the circuit board in a suitable manner such as soldering. The circuit board 122 is maintained at a preselected level within the adapter housing 102 by way of support ribs 123 that may be formed integrally with the housing halves 108, 109.

The circuits disposed on the circuit board 122 may include a transformer circuit that either steps the voltage of the vehicle electrical system up or down to a level appropriate to run a specific electronic device, a charging circuit for charging the electronic device during operation, or even merely a circuit that provides a simple electrical connection between the vehicle and the electronic device. As such, the circuits may include electrical components such as capacitors 125, resistors 126 as well as integrated circuits in the form of chips 127. As part of the circuitry of the adapter 100, an indicator, such as a light-emitting diode ("LED") 128 may be provided and positioned within an opening 130 of the housing 102. This LED 128 indicates to the user that the adapter 100 is operational and a connection has been established with the vehicle electrical system through the lighter socket 102.

The adapter 100 may include a separate exterior cover 132 that is disposed over part of the main body portion 106 of the adapter housing 102. The cover 132 is preferably formed in a continuous loop as best illustrated in FIG. 4 and also preferably has an overall diameter that is slightly less than the overall diameter of the adapter main body portion 106. In this regard, the cover 132 assists in retaining the two housing halves 108, 109 together. To facilitate the gripping thereof by a user when either inserting or removing the adapter 100 from the cigarette lighter socket 101, the cover 132 may include textured portions 133 on opposite extents of the cover 132. These portions 133 may include a plurality of raised knob-like members 134 or any other similar pattern.

The cover 132 may be formed from a flexible or resilient material, such as rubber, an elastomer, or a soft plastic. The circuitry of the adapter 100 inevitably produces heat during operation and in this regard, the cover 132 provides an insulating layer for the adapter 100. The cover 132 also provides a soft exterior surface that may be reliably gripped by the user regardless of the surrounding temperature. As mentioned above, the flexible cover 132 has a slightly smaller overall diameter than the main body portion 106, and the cover 132 overlies the arm body portion 106 in a recessed area 136 that is formed between two raised edge or wall portions 137.

In an important aspect of the invention, the adapter 100 includes a contact member 160 having a pair of contact member arms 140 that provide a ground path or contact between a ground of the adapter circuitry and a ground of the vehicle electrical system. The vehicle system ground typically includes the interior walls 141 of the cigarette lighter socket 101 (FIG. 8). The ground circuit of the adapter may terminate in one contact pad 142 disposed on one surface 143 of the circuit board 122, as illustrated in FIGS. 5 and 8, or it may include two such contact pads disposed on opposite surfaces of the circuit board 122. In any event, the contact member arms 140 are maintained in contact with the ground circuit in a solderless manner, thereby saving in assembly costs of the adapter 100 as well as prolonging the life of the adapter 100.

As best illustrated in FIGS. 6–10, the ground contact member 160 possesses a generally E-shape with a clip portion 145 and a pair of opposing terminals or contact arm portions 140 that extend from the clip portion 145 in a cantilevered fashion. The clip portion 145 and contact arms 140 are interconnected by a tail portion 129 and a body portion 147. The contact member 160 is formed from a resilient material such as a spring steel or copper and may be plated to increase its conductivity. The contact arm portions 140 are spaced apart from the clip portion 145 a preselected distance so that they will project out of a pair of openings 149 formed in the housing halves 108 and 109.

The clip portion 145 possesses a generally U-shape with a pair of legs 162 and an interconnecting spine portion 164 which cooperatively define a passageway 166 there between. The legs 162 are angularly disposed with respect to each other. A free end 168 of each leg 162 is disposed opposite the spine 164. The legs 162 converge from a point of maximum separation 170 adjacent the spine 164 to a point of minimum separation 172 near the free ends 168 and diverge from the point of minimum separation 172 to a point of intermediate separation 174 at the free ends 168. A lead-in surface 169 is defined on the legs 162 between the free ends 168 and the point of minimum separation 172. An entrance 176 is defined between the legs 162 at the point of minimum separation 172. The spine 164 is formed to provide a biasing force between the legs 162 at the entrance 176 such that the legs 162 are in confronting alignment with each other and on opposite sides of the circuit board 122, when the circuit board 122 engages the passageway 166. At least one of the legs 162 is aligned with and abuts one ground contact pad 142. The clip portion 145 is moved into a tensioned state such that when the contact member 160 is installed on the circuit board 122 the clip portion 145 exerts a compressive force on the circuit board 122. A first force axis $F_1$ is defined along the point of contact of the legs 162 with the circuit board. The lead-in surface 169 engages the circuit board 122 at the notch 182 and the legs 162 slightly deflect a sufficient distance to permit the circuit board 122 to move past the entrance 176 into the passageway 166. When fully installed the spine 169 engages the notch 182. The confronting alignment of the legs 162 provides equal and opposite forces on the circuit board 122.

The contacts each include a tail portion 129, a body portion 147, and an arm portion 140. Each tail portion 129 is a generally flat element disposed coplanar with a respective leg 162 and extends laterally in both directions normal thereto such that the legs 162 and tails 129 cooperate to define and describe a cruciform element. Accordingly, the tails 129 are also angularly disposed with respect to each other as are the legs 162. The tails 129 intersect the legs 162 between the point of minimum separation 172 and the spine 164. A first extension portion 178 of the tails 129 extends from the legs 162 and terminates at a free end 163. The first extension portion is disposed opposite the body portion 147, such that the first extension 178 and the body portion 147 are disposed on opposite sides of the legs 123. Preferably, the first extension 178 provides increased compression contact with a ground contact pad 142 along a second force axis $F_2$ which is normal to the first force axis $F_1$.

The body portions 147 interconnect a second end 180 of the tails 129 and the contact arm portions 140. The ground contact member 140 further includes step portions 154 at the free ends 155 of the contact arm portions 140. These step portions 154 are angularly offset from the legs 162 and engage opposing edges 156 of the housing contact openings 149. Thus, it can be seen that the contact member 160 contact arm portions 140 are held in place within the housing 102 at the free ends 155 of the contact arm portions 140.

When the second contact member 160 is inserted into the adapter housing half 109 as shown in FIGS. 5 and 11, the clip leg portions 162 slightly deflect to allow the circuit board 122 past the entrance 176 and into the passageway 166 as described above. The first extensions 178 and legs 162 now contact the circuit board 122 and the ground contact pad(s) 142, such that the clip portion 145 is in a first tensioned state $T_1$ as shown in detail in FIG. 12. The contact arm portions 140 slightly deflect toward the interior of the adapter housing and the step portions 154 are depressed when they contact the cigarette lighter socket 101 as shown in FIG. 7. As this occurs, the legs 162 and extensions 178 are slightly deflected such that an increased portion of each engages the contact pad 142. Both contact arm portions 140 are so moved that any force exerted by them on the circuit board occurs in direct opposition to each other.

When the adapter 100 is inserted into a cigarette lighter socket 101 as best illustrated in FIG. 8, the second contact member 160 is further moved into a second tensioned state $T_2$ (FIG. 8). In this state, the contact arm portions 140 are evenly depressed or deflected by the interior walls of the cigarette lighter socket 101 toward the interior of the adapter housing 100, thereby causing the legs 162 and first extensions 178 to move to a position where they are in maximum contact against the circuit board 122 and contact pad(s) 142 thereon. Preferably, the dimensions of the second contact member 160 are substantially equal about an axis or plane passing through the spine 164 and entrance 176 so that in both the first and second tensioned states, $T_1$ and $T_2$, the legs 162 and extensions 178 are generally aligned with each other on opposite sides of the circuit board 122 so that the contact member 160 exerts equal forces that balance, or cancel each other so as not to exert any detrimental uneven stress on the circuit board 122. This design, in effect, is one where the contact member 160 exerts a balancing force on the circuit board.

The contact members of the present invention may be easily manufactured by a suitable process, such as stamping and forming and the solderless contact that occurs between them and the circuit board eliminates the need for a soldered joint which may deteriorate over time with repeated insertion and removal cycles of the adapter.

It will be understood that the embodiment of the present invention which has been described herein is merely illustrative of some of the applications of the principles of the present invention. Various modifications may be made by those skilled in the art without departing from the true spirit and scope of the invention.

I claim:

1. An adapter for establishing an electrical connection between electrical power system of a vehicle and an electronic device situated within an interior portion of the vehicle, said vehicle having a cigarette lighter receptacle and the vehicle power system having a hot contact and a ground contact associated with said cigarette lighter receptacle, the adapter comprising:

an elongated housing, the adapter housing having a body portion and a barrel portion sized to fit within said cigarette lighter receptacle, the adapter housing having an internal cavity extending between said body and barrel portions;

a circuit board disposed within said housing, the circuit board having a connecting circuit disposed thereon for providing a connection between said electronic device and said vehicle power system, said connecting circuit including a hot portion and a ground portion;

a first contact member disposed in said adapter housing barrel portion in opposition to said cigarette lighter receptacle hot contact, said first contact member being connected to said connecting circuit hot portion; and a second contact member disposed in said adapter housing barrel portion in opposition to said cigarette lighter receptacle ground contact;

said second contact member including a clip portion and a pair of terminal portions;

said clip having a pair of legs and an interconnecting spine portion;

each said leg having a free end opposite said spine portion so that said free ends cooperatively define an entrance to a passageway;

said terminal portions each including a tail portion, a body portion, a contact arm portion, and a free end for interconnecting said vehicle power system ground contact and said circuit board ground connecting circuit;

each said tail portion formed normal to said leg as part of and coplanar with one of said legs;

said contact arm portion extending from said body portion which interconnects said tail portion and said contact arm portion for engaging said adapter housing;

said passageway engaging said circuit board such that said clip is biased into a first tensioned position wherein a point on said leg between said free end and said tail portion contacts said circuit board and said connecting circuit ground portion thereof; and said contact arm portions disposed in opposing alignment with each other on opposite sides such that forces they exert upon said circuit board generally balance each other to thereby avoid the imposition of detrimental unbalanced stress on said circuit board.

2. The adapter as defined in claim 1, wherein said adapter housing barrel portion includes a pair of opening that partially receive said second contact members therein and each of said second contact member contact arm portion free ends includes a step portion that engages an edge of said contact openings.

3. The adapter as defined in claim 1, wherein said contact that occurs between said second contact member and said circuit board and connecting circuit ground portion is a frictional contact.

4. The adapter as defined in claim 1, wherein said second contact member contact arm portions are free to deflect toward an interior of said adapter housing when said adapter is inserted into said cigarette lighter receptacle.

5. The adapter as defined in claim 1, wherein said second contact member has a general E-shape and said clip portion and contact arm portions are interconnected by a tail portion.

6. The adapter as defined in claim 1, wherein said contact point is defined along a first axis.

7. The adapter as defined in claim 1, further including a flexible exterior cover overlying said main body portion.

8. The adapter as defined in claim 7, wherein said exterior cover is a continuous collar member formed from an elastomeric material.

9. The adapter as defined in claim 1, wherein said adapter housing is formed with two opposing mating halves.

10. The adapter as defined in claim 9, wherein each of said adapter housing mating halves includes at least one pair of retaining members formed on an interior surface thereof and disposed within said adapter housing barrel portion.

11. The adapter as defined in claim 10, wherein said second contact member contact arm portions are free to deflect toward an interior of said adapter hosing when said adapter is inserted into said cigarette lighter receptacle.

12. The adapter as defined in claim 1, wherein said tail portion further includes a first extension portion extending from each said clip leg, longitudinally aligned with said tail portion and oppositely disposed on said legs away from said body portion.

13. The adapter as defined in claim 12, wherein said first extension contacts said circuit board and said connecting circuit ground portion.

14. The adapter as defined in claim 13, wherein said contact that occurs between said first extensions and said circuit board and connecting circuit ground portion is a frictional contact.

15. The adapter as defined in claim 14, wherein said contact is defined along a second axis which is normal to said first axis of contact.

16. A connector for connecting an electrical device to a vehicle electrical system, comprising:

an elongated hollow body having a first opening and a pair of second openings formed therein;

a circuit board disposed within said hollow body;

a first conductive contact mounted within said body and partially extending through said first opening;

a second conductive contact mounted within said body and having a pair of contact arms partially extending through said second openings;

said second contact member disposed in said adapter housing barrel portion in opposition to said cigarette lighter receptacle ground contact;

said second contact member including a clip portion and a pair of contact arm portions;

said clip having a pair of interconnected cruciform elements disposed in generally planar alignment;

said clip further having a pair of free ends disposed along a longitudinal axis of said clip, and extensions extending normal to said longitudinal axis;

said free ends cooperatively define an entrance to a passageway defined between said cruciform elements;

said contact arm portions extending from a pair of said extensions and each having a free end, and a contact arm portion for engaging said cigarette lighter receptacle;

said passageway engaging said circuit board;

said contact arm free ends engaging said adapter housing;

said engagement of said passageway biasing said clip into a first tensioned position wherein contact points disposed between said free ends and said extensions contact with said circuit board and said connecting circuit ground portion thereof;

said contact arm portions disposed in opposing alignment with each other on opposite sides such that forces they exert upon said circuit board when in said first tensioned position generally balance each other to thereby avoid the imposition of detrimental unbalanced stress on said circuit board; and, said circuit board arm portions being deflectable toward said circuit board when said connector is inserted into a cigarette lighter receptacle, whereby deflections of said contact arms moves said free ends and extension into more firmer contact with said circuit board.

17. The connector as defined in claim 16, further includes an exterior flexible covering that surrounds a portion of said body.

18. The connector as defined in claim 16, wherein said contact with said clip said circuit board and connecting circuit ground portion is defined along a first axis.

19. The connector as defined in claim 18, wherein said contact with said extensions and said circuit board and connecting circuit ground portion is defined along a second axis.

20. The connectors defined in claim 19, wherein said first axis is normal to said second axis.

* * * * *